(12) United States Patent  (10) Patent No.: US 7,432,588 B2
Kimura  (45) Date of Patent: Oct. 7, 2008

(54) SEMICONDUCTOR DEVICE AND METHOD OF FABRICATING THE SAME

(75) Inventor: Naoto Kimura, Yanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/242,850

(22) Filed: Oct. 5, 2005

(65) Prior Publication Data

US 2006/0138614 A1   Jun. 29, 2006

(30) Foreign Application Priority Data

Dec. 28, 2004  (JP)  ............................. 2004-381375

(51) Int. Cl.
  *H01L 23/48*  (2006.01)
  *H01L 25/065*  (2006.01)
  *H01L 21/44*  (2006.01)
(52) U.S. Cl. .................. 257/686; 257/666; 257/690; 257/777; 257/E23.037; 257/E23.052; 438/106; 438/109
(58) Field of Classification Search ............... 257/686, 257/690, 777
  See application file for complete search history.

(56) References Cited

U.S. PATENT DOCUMENTS 6,133,637 A * 10/2000 Hikita et al. ............... 257/777

6,750,080 B2 * 6/2004 Masuda et al. ............ 438/106

FOREIGN PATENT DOCUMENTS

| JP | 07-335826   | * 12/1995 |
| JP | 08-330508   |   12/1996 |
| JP | 2001-358285 |   12/2001 |

* cited by examiner

*Primary Examiner*—Dao H Nguyen
(74) *Attorney, Agent, or Firm*—Young & Thompson

(57) ABSTRACT

A semiconductor device 100 comprises a leadframe 104 having an island portion 102; two chips of a first semiconductor chip 110 and a second semiconductor chip 120, respectively having top surfaces having, in the peripheral areas thereof, pad portions respectively having a plurality of first bonding pads 112 and second bonding pads 122 arranged therein and a back surface, being placed respectively on both surfaces of the island portion 102 of the leadframe 104 so as to oppose the back surface sides thereof to the island portion 102; and a mold resin 150 molding two these first semiconductor chip 110 and second semiconductor chip 120, wherein two these first semiconductor chip 110 and second semiconductor chip 120 have nearly same configurations of the pad portions; and two these semiconductor chips are arranged so as to shift the pad portions from each other.

6 Claims, 14 Drawing Sheets

SEMICONDUCTOR DEVICE AND METHOD OF FABRICATING THE SAME

This application is based on Japanese patent application No. 2004-381375 the content of which is incorporated hereinto by reference.

BACKGROUND OF THE INVENTION

1. Field of the Invention

The present invention relates to a semiconductor device and a method of fabricating the same, and in particular to a semiconductor device having, as being provided on both surfaces of a leadframe, semiconductor chips each having a plurality of bonding pads.

2. Description of the Related Art

One known conventional semiconductor device is such as being described for example in Japanese Laid-Open Patent Publication No. H07-335826. The semiconductor device described in this document is shown in FIG. 12. The semiconductor device 800 have two semiconductor chips 8a, 8b disposed, as being rotationally shifted from each other, on both surfaces of a die pad 2 of a leadframe. This makes it possible to ease congestion of leads 3 and wires 9a, 9b in the peripheral portion, and to facilitate the fabrication.

Another semiconductor device described in Japanese Laid-Open Patent Publication No. H08-330508 is shown in FIGS. 13A and 13B. The semiconductor device 810 described in this document has two semiconductor chips 11D, 11E, disposed as being shifted from each other in a parallel or orthogonal manner, mounted on one surface of an island of a leadframe, wherein thus-shifted semiconductor chips 11D and 11E have a plurality of pads 13D and 13E, respectively, arranged in the peripheral portions of the top surfaces thereof.

Still another semiconductor device described in Japanese Laid-Open Patent Publication No. 2001-358285 is shown in FIG. 14. The semiconductor device 820 has, on both surfaces of an interconnection substrate 21, two semiconductor chip groups CH3(CH1), CH2(CH4), respectively, as being shifted from each other only in the horizontal, or linear direction. The interconnection substrate 21 has through-hole electrodes provided therein, by which the inner electrodes of the individual semiconductor chips CH1 and CH4 are connected with each other. In the semiconductor device 820, a plurality of external electrodes BP1 to BP14 of the semiconductor chip CH3 are electrically connected through bonding wires 23 to a plurality of bonding areas 22B on the interconnection substrate 21, and similarly in the semiconductor chip CH4, a plurality of external electrodes are electrically connected through the bonding wires to a plurality of bonding areas on the interconnection substrate 21.

The prior arts described in the above documents, however, gave no consideration on mounting of the chips on both surfaces of the island so as to avoid overlapping of the boding pads of the chips. Any semiconductor devices having the semiconductor chips mounted on both surfaces of the island portion, as being fabricated by the conventional methods of fabricating the semiconductor devices, may sometimes result in parallel overlapping, in a plan view, of the wires connecting the pads of the individual chips and the leads, so that any accidental omission of one of the wires has been very unlikely to be detected in manufacturing inspection based on X-ray transmission image or the like. This has been a causal factor of degradation in the fabrication reliability of semiconductor device.

The present invention was conceived after considering the above-described situations, and an object thereof to provide a semiconductor device having a good fabrication reliability, and a method of fabricating the same.

SUMMARY OF THE INVENTION

According to the present invention, there is provided a semiconductor device which comprises:

a leadframe having an island portion;

two peripheral-terminal semiconductor chips each having a top surface having, in the peripheral area thereof, a pad portion having a plurality of bonding pads arranged therein and a back surface, being placed respectively on both surfaces of the island portion of the leadframe so as to oppose the back surface sides thereof to the island portion; and a mold resin molding two these semiconductor chips, wherein two these semiconductor chips have nearly same configurations of the pad portions; and two these semiconductor chips are arranged so as to shift the pad portions from each other.

Because the individual electrodes of the semiconductor chips disposed up and down do not overlap with each other, the present invention makes it possible to confirm connection of the semiconductor device in an exact manner, and this consequently improves reliability of the semiconductor device.

According to the present invention, there is also provided a semiconductor device which comprises:

a leadframe having an island portion;

two peripheral-terminal semiconductor chips each having a top surface having, in the peripheral area thereof, a plurality of bonding pads arranged therein and a back surface, being placed respectively on both surfaces of the island portion of the leadframe so as to oppose the back surface sides thereof to the island portion; and a mold resin molding two these semiconductor chips, wherein two these semiconductor chips are arranged so as to shift the plurality of bonding pads from each other.

Because the individual electrodes of the semiconductor chips disposed up and down do not overlap with each other, the present invention makes it possible to confirm connection of the semiconductor device in an exact manner, and this consequently improves reliability of the semiconductor device.

In the semiconductor device, the leadframe may have a plurality of leads which are wire-bonded to the plurality of bonding pads of two these semiconductor chips respectively at planar sites different from each other.

Because the individual connection portions on the lead side wire-bonded with the semiconductor chips disposed up and down do not overlap with each other, this configuration makes it possible to confirm connection on the lead side of the semiconductor device in an exact manner, and this consequently improves reliability of the semiconductor device.

In the semiconductor device, two these semiconductor chips may be arranged as being shifted in the horizontal direction in a plan view of the semiconductor device, so as to avoid parallel overlapping of the upper and lower wires used for wire-bonding from the plurality of bonding pads to the plurality of leads.

Because the individual wires do not overlap with each other, this configuration makes it possible to confirm connection of the semiconductor chips to the leads in the semiconductor device in an exact manner, and this consequently improves reliability of the semiconductor device.

According to the present invention, there is also provided a method of fabricating a semiconductor device, which comprises:

placing a first semiconductor chip, having a top surface having, in the peripheral area thereof, a pad portion having a plurality of first bonding pads arranged therein and a back surface, on one surface of an island portion of a leadframe so as to oppose the back surface therewith;

placing a second semiconductor chip, having a top surface having, in the peripheral area thereof, a pad portion having a plurality of second bonding pads arranged therein and having a nearly same geometry with the pad portion of the first semiconductor chip, and a back surface, on the other surface of the island portion of the leadframe, so as to oppose the back surface therewith, and so as to shift the pad portion of the first semiconductor chip and the pad portion of the second semiconductor chip from each other; and molding the first semiconductor chip and the second semiconductor chip with a mold resin.

Because the individual electrodes of the semiconductor chips disposed up and down do not overlap with each other, the present invention makes it possible to confirm connection of the semiconductor device in an exact manner, and this consequently improves reliability of the semiconductor device.

According to the present invention, there is also provided a method of fabricating a semiconductor device, which comprises:

placing a first semiconductor chip, having a top surface having, in the peripheral area thereof, a plurality of first bonding pads arranged therein and a back surface, on one surface of an island portion of a leadframe so as to oppose the back surface therewith;

placing a second semiconductor chip, having a top surface having, in the peripheral area thereof, a plurality of second bonding pads arranged therein and a back surface, on the other surface of the island portion of the leadframe, so as to oppose the back surface therewith, and so as to shift the plurality of first bonding pads of the first semiconductor chip and the plurality of second bonding pads of the second semiconductor chip from each other; and molding the first semiconductor chip and the second semiconductor chip with a mold resin.

Because the individual electrodes of the semiconductor chips disposed up and down do not overlap with each other, the present invention makes it possible to confirm connection of the semiconductor device in an exact manner, and this consequently improves reliability of the semiconductor device.

The present invention therefore makes it possible to provide a semiconductor device having a good fabrication reliability, and a method of fabricating the same.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
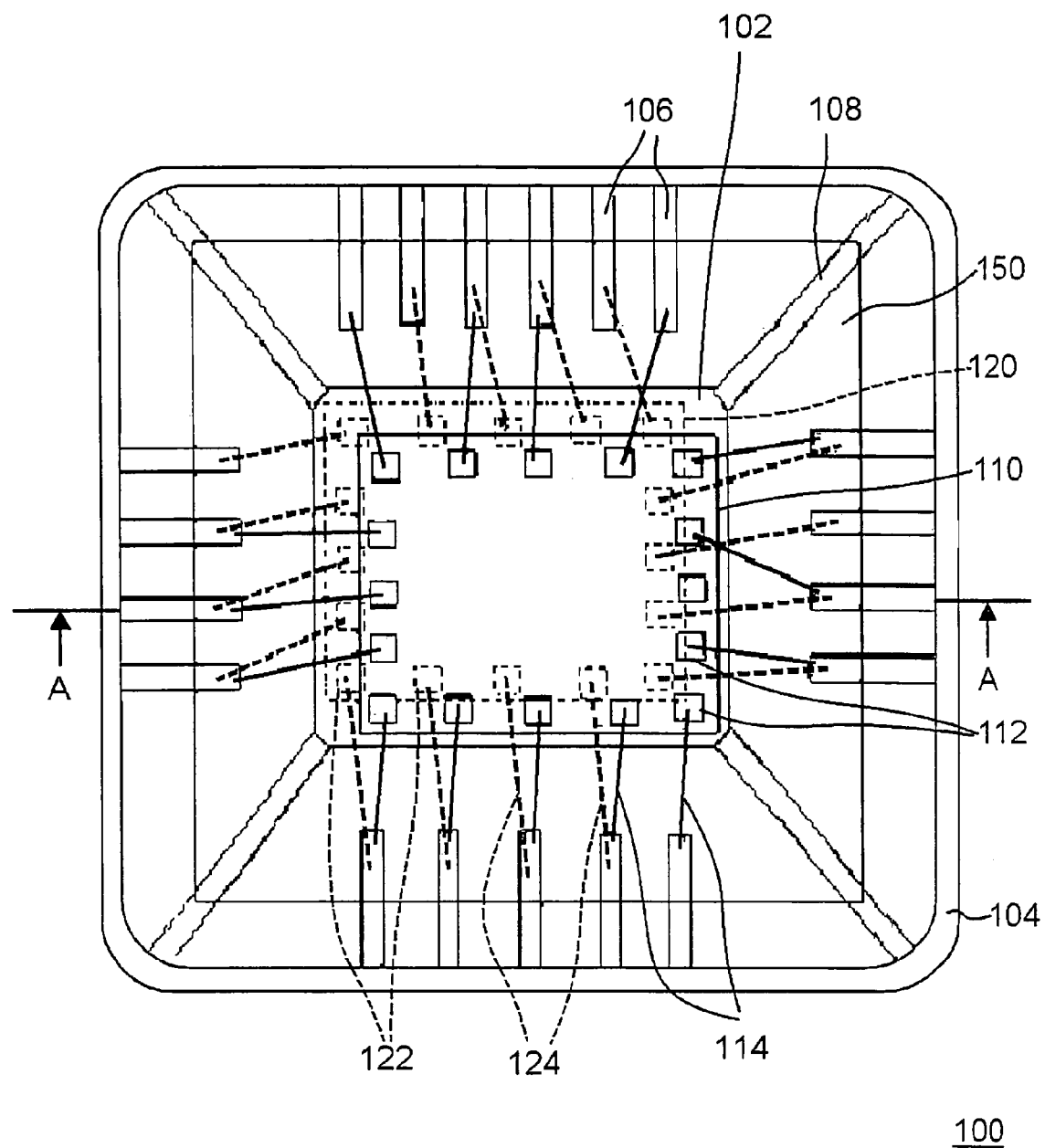
FIG. 1 is a plan view of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will describe embodiments of the present invention referring to the attached drawings. It is to be noted that any similar constituents in all of the drawings will be given with similar reference numerals, allowing omission of repetitive explanation on occasions.

FIRST EMBODIMENT

FIG. 1 is a plan view of a semiconductor device according to a first embodiment. The semiconductor device (semiconductor device 100) of the first embodiment comprises a leadframe (leadframe 104) having an island portion (island portion 102); two peripheral-terminal semiconductor chips (a first semiconductor chip 110 and a second semiconductor chip 120) each having a top surface having, in the peripheral area thereof, a pad portion having a plurality of bonding pads (first bonding pads 112 and second bonding pads 122) arranged therein and a back surface, being placed respectively on both surfaces of the island portion of the leadframe so as to oppose the back surface sides thereof to the island portion; and a mold resin (mold resin 150) molding two these semiconductor chips, wherein two these semiconductor chips have nearly same configurations of the pad portions (first bonding pads 112 and second bonding pads 122); and two these semiconductor chips are arranged so as to shift the pad portions from each other.

It is to be noted that any configurations not relevant to the essence of the present invention are omitted from the drawings below.

In this embodiment, the first semiconductor chip 110 and the second semiconductor chip 120 have a top surface 110a and a top surface 120a, respectively, having in the peripheral areas thereof a plurality of the first bonding pads 112 and the second bonding pads 122 according to nearly same arrangements, and respectively have a back surface 110b and a back surface 120b.

Figure 2:
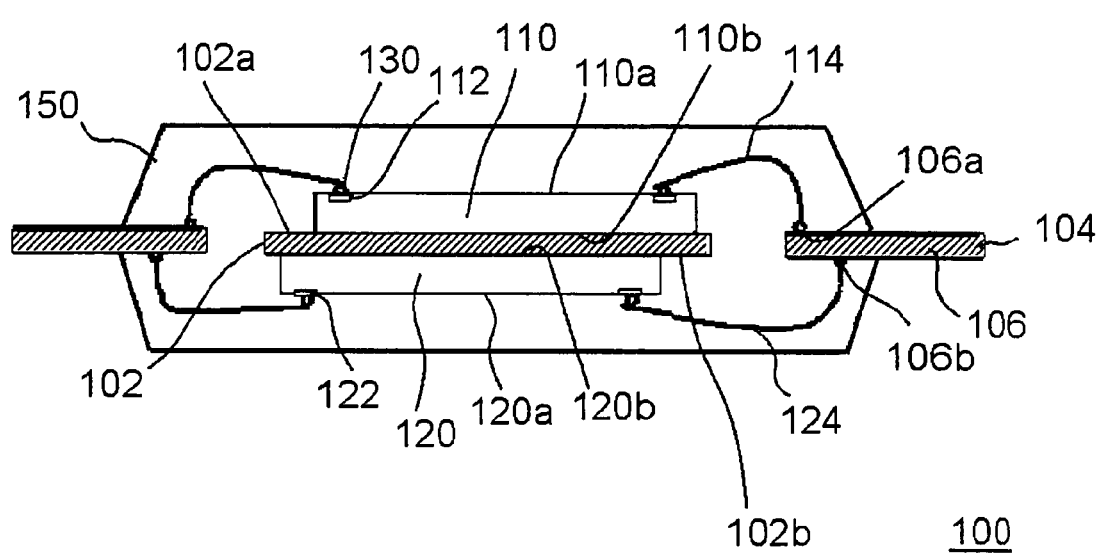
FIG. 2 is a sectional view, taken along line A-A, of the semiconductor device shown in FIG. 1.

FIG. 2 is a sectional view of the semiconductor device 100 shown in FIG. 1, taken along line A-A. Explanation will be made below, referring to FIG. 1 and FIG. 2. The first semiconductor chip 110 is disposed so as to oppose the back surface 110b thereof with one surface 102a of the island portion 102 of the leadframe 104, and the second semiconductor chip 120 is disposed so as to oppose the back surface 120b thereof with the other surface 102b of the island portion 102 of the leadframe 104. The plurality of first bonding pads 112 of the first semiconductor chip 110 and the plurality of second bonding pads 122 of the second semiconductor chip 120 herein are arranged as being shifted from each other in the horizontal direction.

Each of the first bonding pads 112 of the first semiconductor chip 110 is electrically connected to each of the leads 106 of the leadframe 104, using an upper wire 114 typically composed of a thin gold wire, and through a bump 130. Each of the second bonding pads 122 of the second semiconductor chip 120 is electrically connected to each of the leads 106 of the leadframe 104, using a lower wire 124 typically composed of a thin gold wire, and through the bump 130. The upper wire 114 and the lower wire 124 respectively connected to each of the first bonding pads 112 of the first semiconductor chip 110 and to each of the second bonding pads 122 of the second semiconductor chip 120 are wire-bonded through the bumps 130 at planar sites on each lead 106 differing from each other, that are, a first connection site 106a and a second connection site 106b.

Next paragraphs will describe a method of fabricating the semiconductor device 100 of this embodiment, referring to FIG. 3 to FIG. 8. FIG. 3 to FIG. 8 are sectional views showing each process step of fabrication of the semiconductor device 100 according to the first embodiment.

Figure 3:
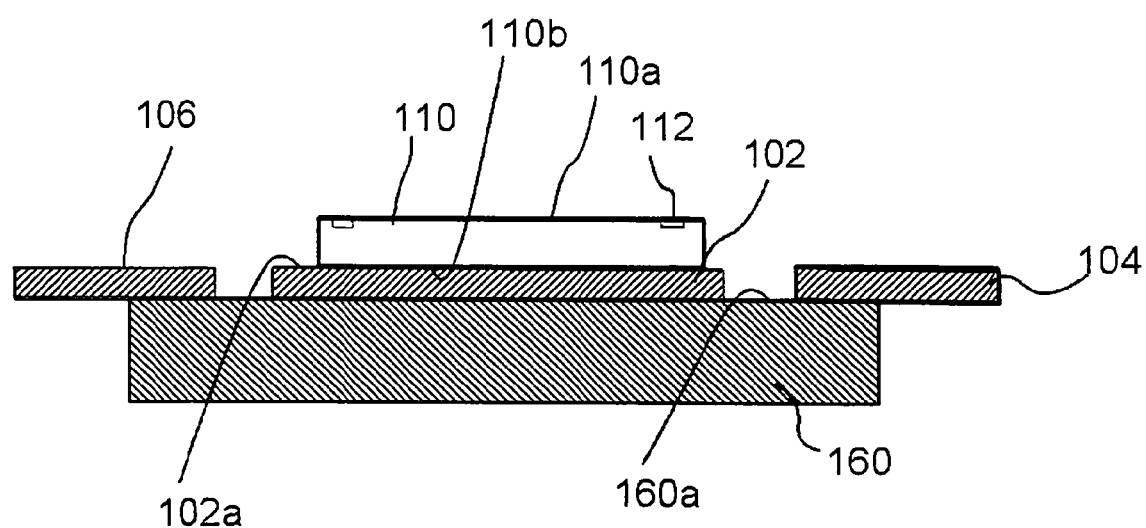
FIG. 3 is a drawing explaining a mounting step of a first semiconductor chip of the semiconductor device shown in FIG. 1.

First, as shown in FIG. 3, on one surface 102a of the island portion 102 of the leadframe 104 placed on a first jig 160 having a flat surface 160a, the first semiconductor chip 110 is placed so as to oppose the back surface 110b thereof with the surface 102a, and the surface 102a of the island portion 102 and the first semiconductor chip 110 are fixed using a conductive adhesive not shown. The mounting step of the first semiconductor chip 110 is thus completed.

Figure 4:
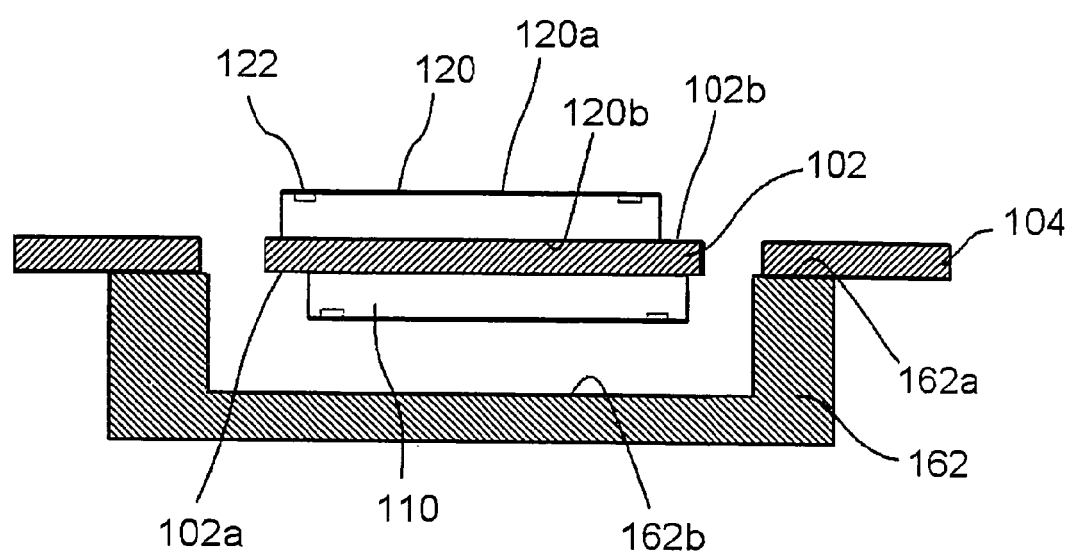
FIG. 4 is a drawing explaining a mounting step of a second semiconductor chip of the semiconductor device shown in FIG. 1.

Next, as shown in FIG. 4, on a second jig 162 having a peripheral flat surface 162a and a recess 162 formed at the center, the leadframe 104 having the first semiconductor chip 110 already fixed thereon as shown in FIG. 3 is placed so as to direct the other surface 102b of the island portion 102 of the leadframe 104 upward. On the other surface 102b of the island portion 102 of the leadframe 104, the second semiconductor chip 120 is placed so as to oppose the back surface 120b thereof with the surface 102b, and the other surface 102b of the island portion 102 and the second semiconductor chip 120 are fixed using a conductive adhesive not shown. In this process, the first semiconductor chip 110 and the second semiconductor chip 120 are arranged as being shifted in the horizontal direction, so as to shift the plurality of first bonding pads 112 of the first semiconductor chip 110 from the plurality of second bonding pads 122 of the second semiconductor chip 120. The mounting step of the second semiconductor chip 120 is thus completed.

Figure 5:
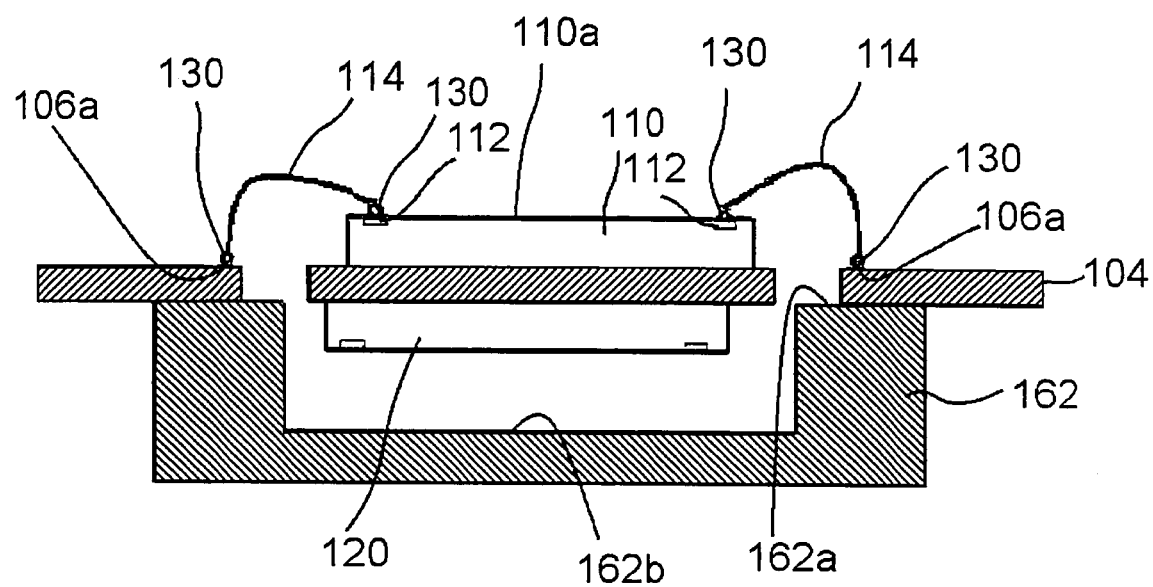
FIG. 5 is a drawing explaining a wire-bonding step of the first semiconductor chip of the semiconductor device shown in FIG. 1.

Next, as shown in FIG. 5, the plurality of the first bonding pads 112 of the first semiconductor chip 110 mounted on the island portion 102 of the leadframe 104 and the plurality of leads 106 of the leadframe 104 are electrically connected in the wire-bonding process. In this process, each of the first bonding pads 112 of the first semiconductor chip 110 is electrically connected at the first connection site 106a of each lead 106 using the upper wire 114 via the bump 130.

Figure 6:
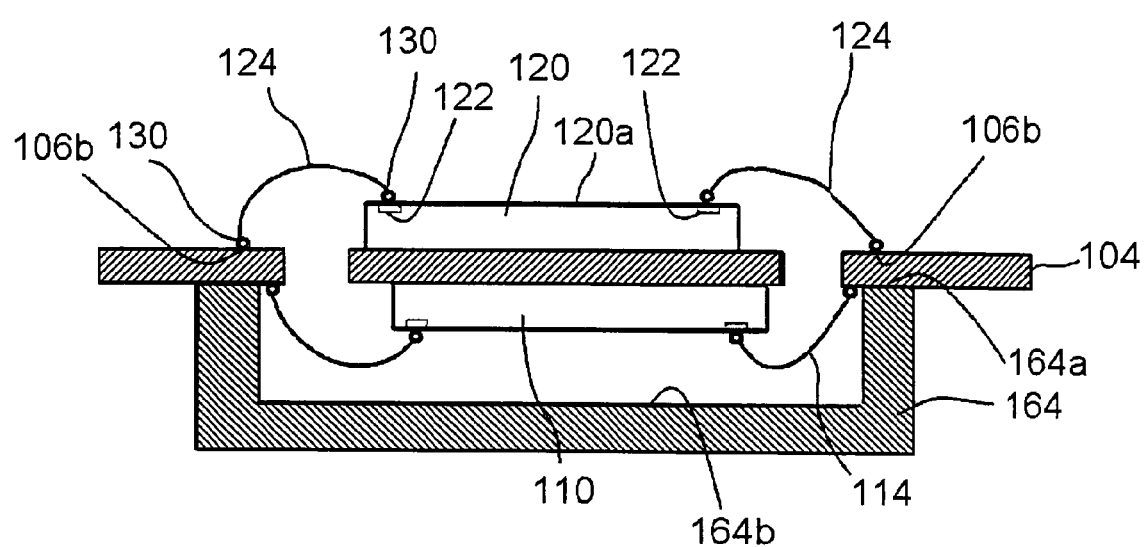
FIG. 6 is a drawing explaining a wire-bonding step of the second semiconductor chip of the semiconductor device shown in FIG. 1.

Next, as shown in FIG. 6, on a third jig 164 having a peripheral flat surface 164a and a recess 164b formed at the center, the first semiconductor chip 110 already wire-bonded as shown in FIG. 5 is placed in a face-down manner. The plurality of second bonding pads 122 of the second semiconductor chip 120 mounted on the island portion 102 of the leadframe 104 and the plurality of leads 106 of the leadframe 104 are electrically connected in the wire-bonding process. In this process, each of the second bonding pads 122 of the second semiconductor chip 120 is electrically connected at the second connection site 106b of each lead 106 using the lower wire 124 via the bump 130.

Figure 7:
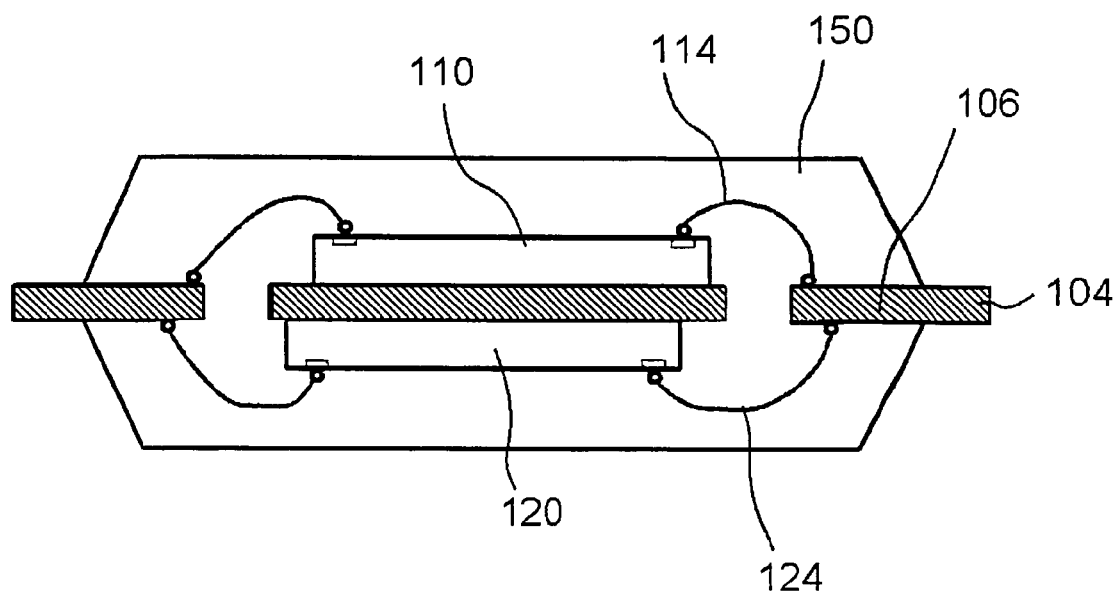
FIG. 7 is a drawing explaining a resin molding step of the semiconductor device shown in FIG. 1.

Next, as shown in FIG. 7, the wire-bonded first semiconductor chip 110 and the second semiconductor chip 120 are molded by the mold resin 150. In this process, the molding is effected as covering the first semiconductor chip 110, second semiconductor chip 120, upper wire 114 and lower wire 124. This contributes to protection of the semiconductor device 100 from external environments, and improvement in the reliability of the device.

Figure 8:
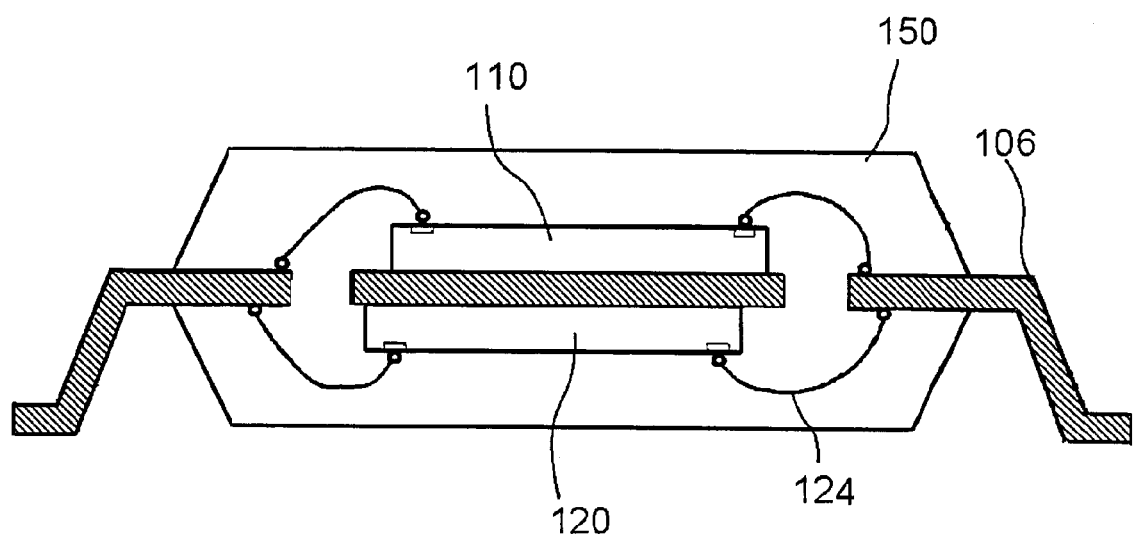
FIG. 8 is a drawing explaining lead shaping of the semiconductor device shown in FIG. 1.

Next, as shown in FIG. 8, the leads 104 are shaped into a predetermined geometry, to thereby complete the semiconductor device 100.

Figure 9:
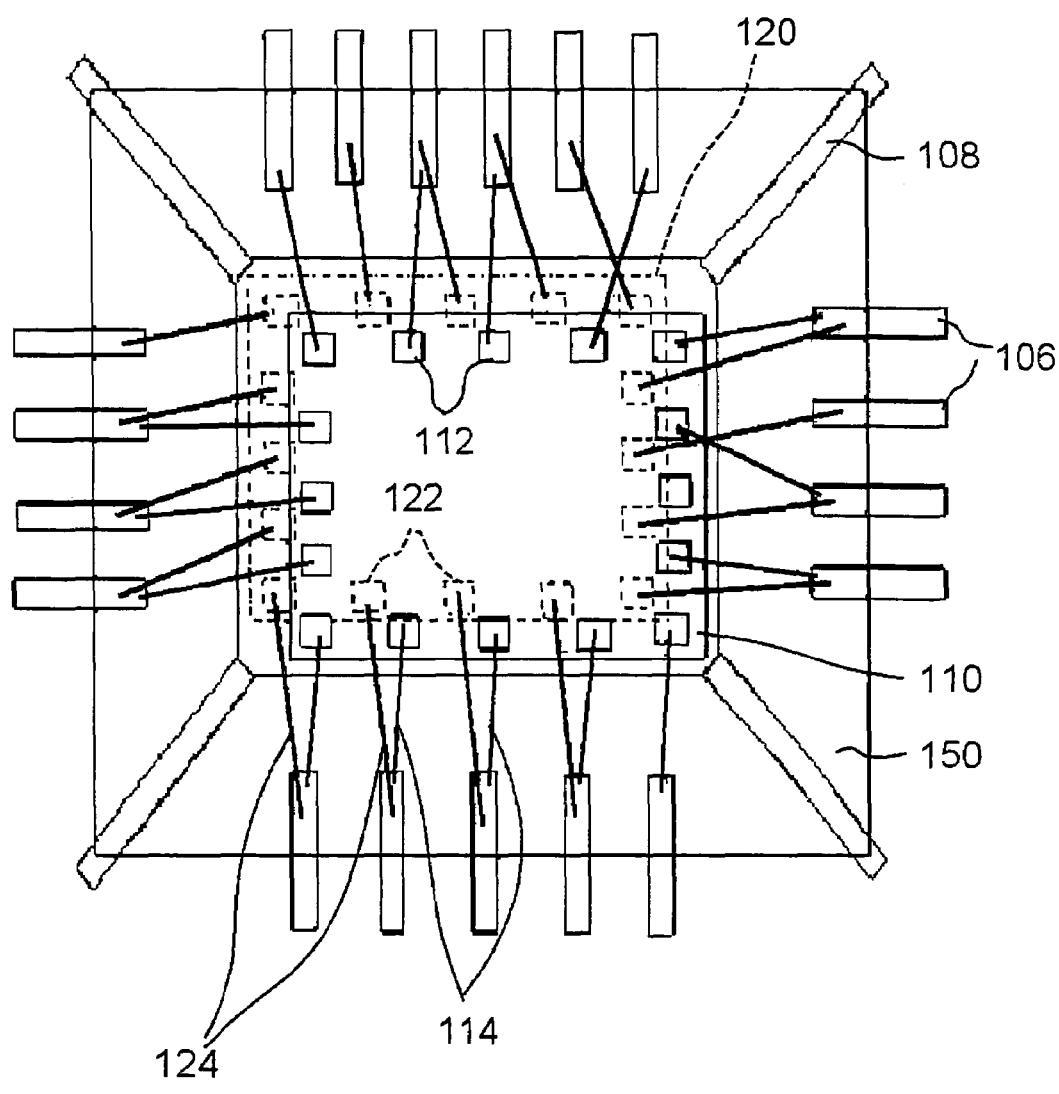
FIG. 9 is a plan view derived from an X-ray transmission image of the semiconductor device shown in FIG. 1.

Thus-fabricated semiconductor device 100 can typically be inspected by confirming an X-ray transmission image. As shown in FIG. 9, the semiconductor device 100 of the first embodiment has the first bonding pads 112 of the first semiconductor chip 110 and the second bonding pads 122 of the second semiconductor chip 120 arranged as being shifted from each other, and has the connection sites on each lead 106 also as being shifted, so that the plurality of the upper wires 114 and the lower wires 124 provided up and down never overlap with each other, and this makes it possible to readily confirm the individual interconnection. This successfully improves the fabrication reliability of the semiconductor device 100.

Figure 10:
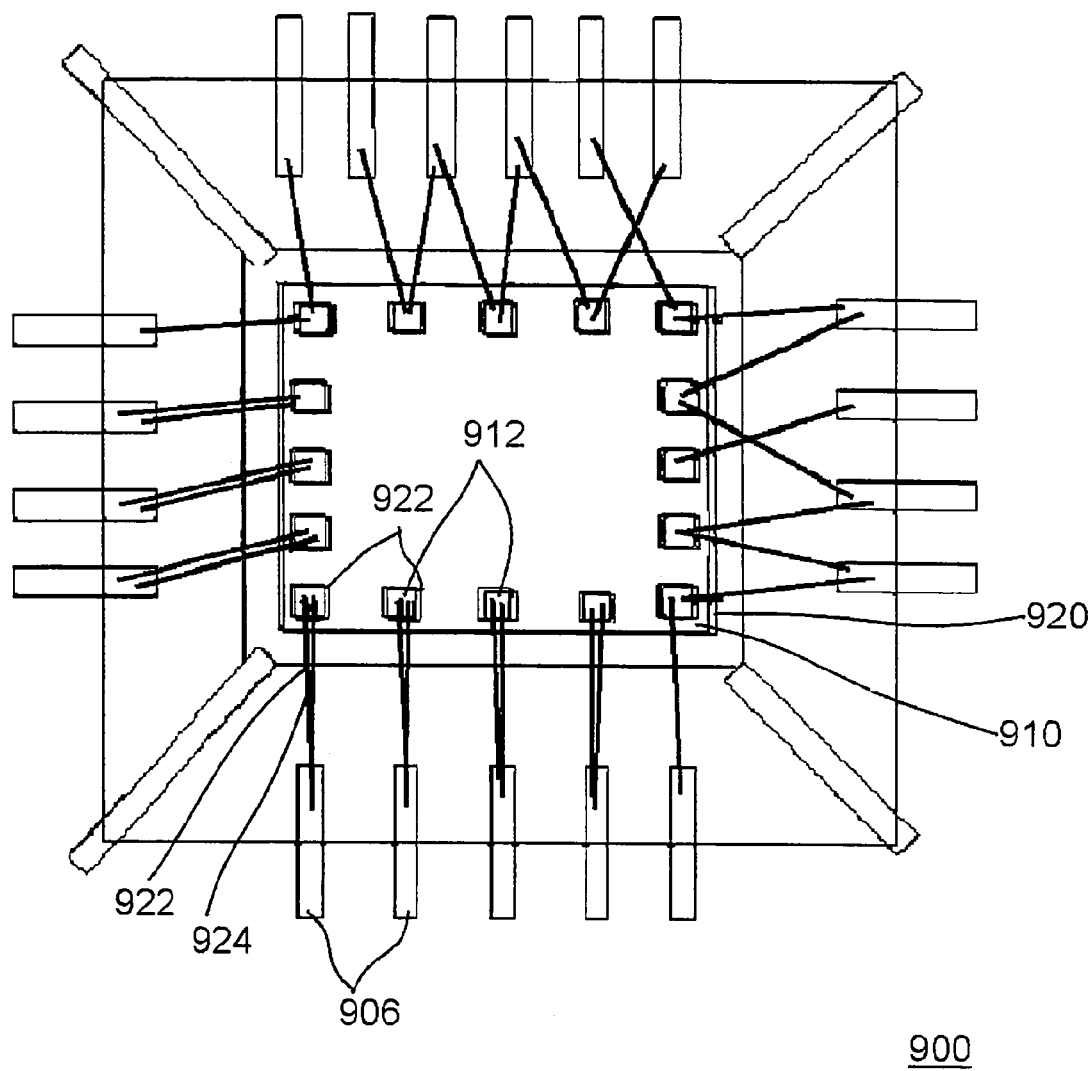
FIG. 10 is a plan view derived from an X-ray transmission image of a conventional semiconductor device.

In comparison, it is known from a plan view shown in FIG. 10, derived from an X-ray transmission image of a semiconductor device fabricated by a conventional method, that a first semiconductor chip 910 and a second semiconductor chip 920 are disposed at the same site, and consequently first bonding pads 912 of the first semiconductor chip 910 and second bonding pads 922 of the second semiconductor chip 920 overlap each other. This causes partial overlapping between upper wires 914 and lower wires 924, and thereby makes it difficult to confirm any accidental omission of one of the overlapped wires.

As has been explained in the above, the method of fabricating the semiconductor device according to the embodiment of the present invention makes it possible to provide the semiconductor device having a good fabrication reliability.

SECOND EMBODIMENT

Figure 11:
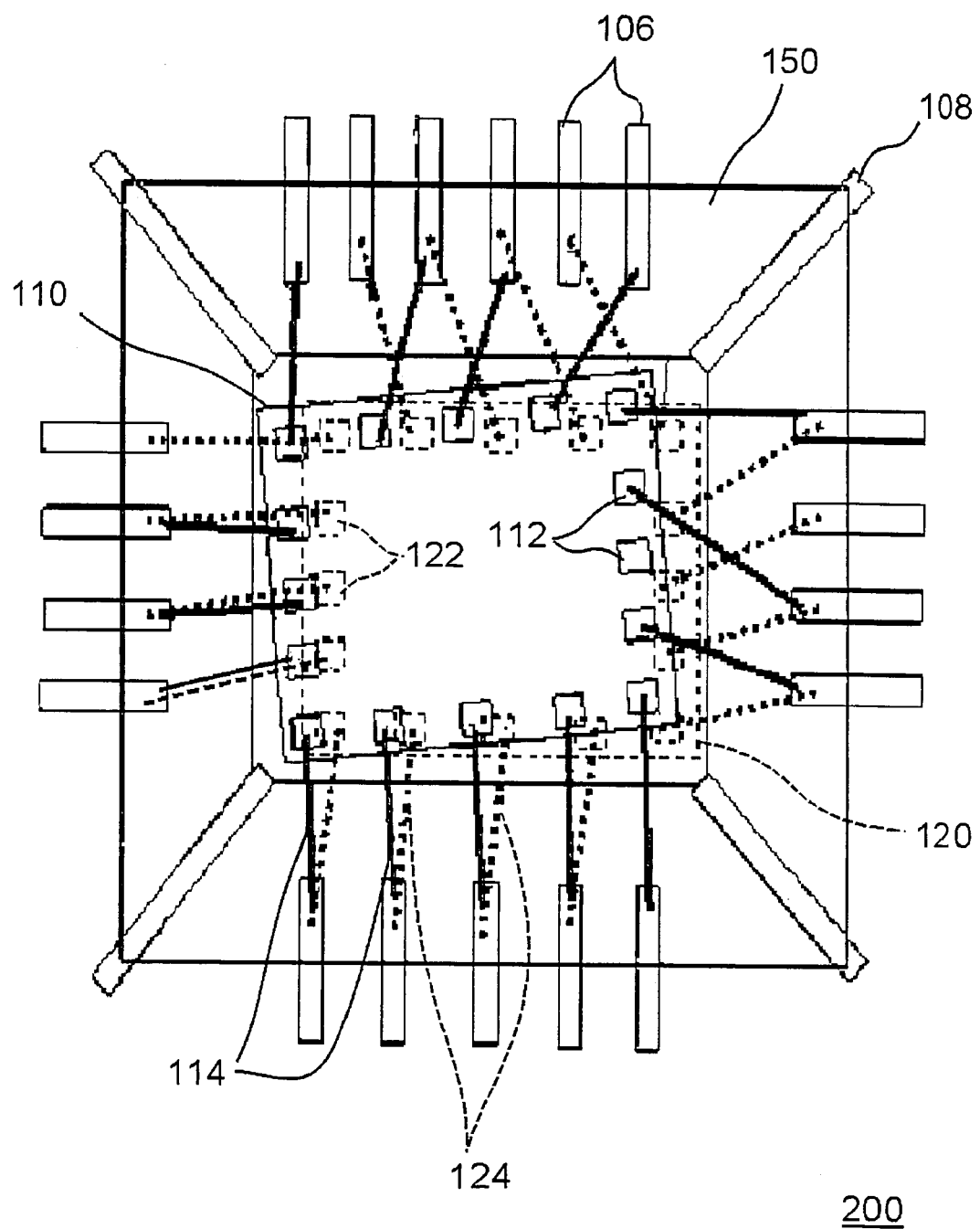
FIG. 11 is a plan view of the a semiconductor device according to another embodiment of the present invention.
Figure 12:
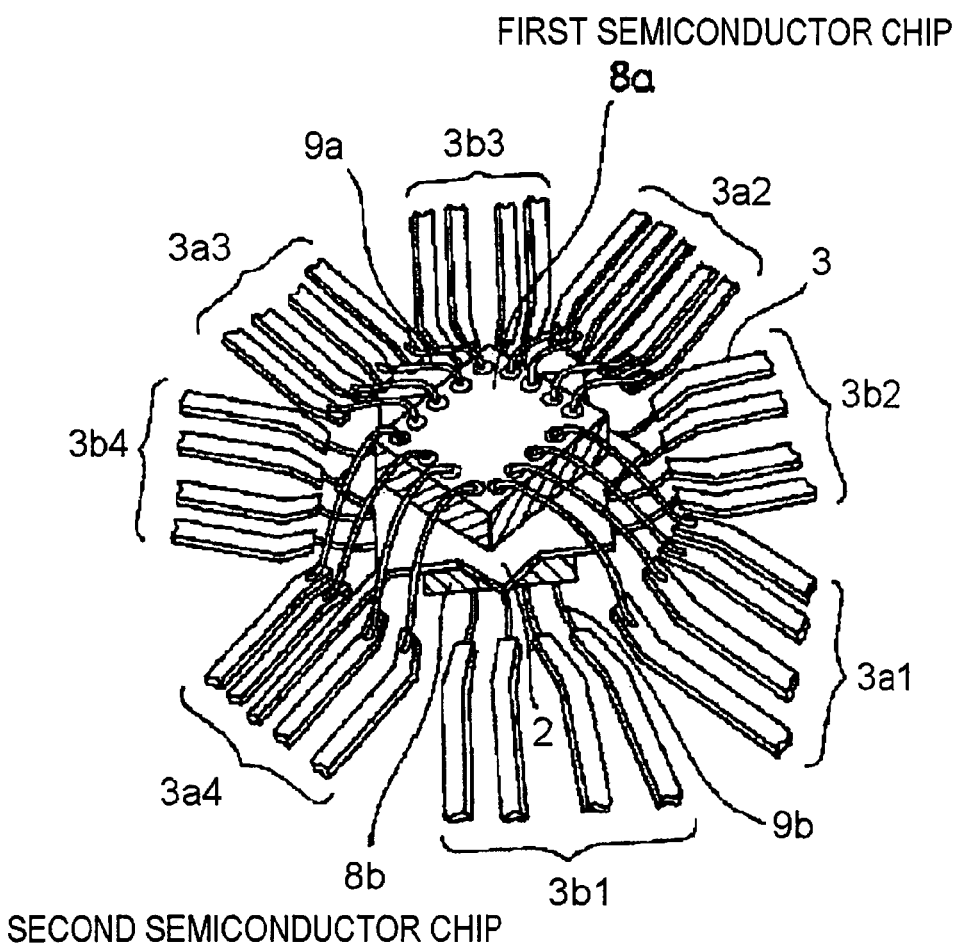
FIG. 12 is a perspective view of a conventional semiconductor device.
Figure 13B:
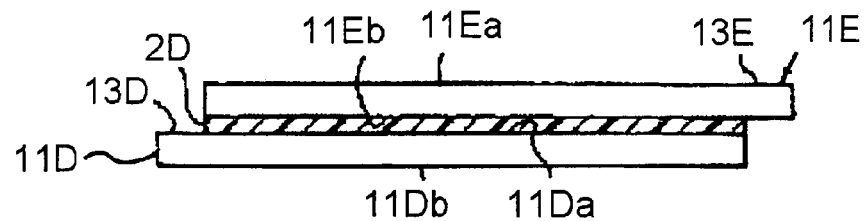
FIGS. 13A and 13B are a plan view and a sectional view, respectively, of a conventional semiconductor device.
Figure 13A:
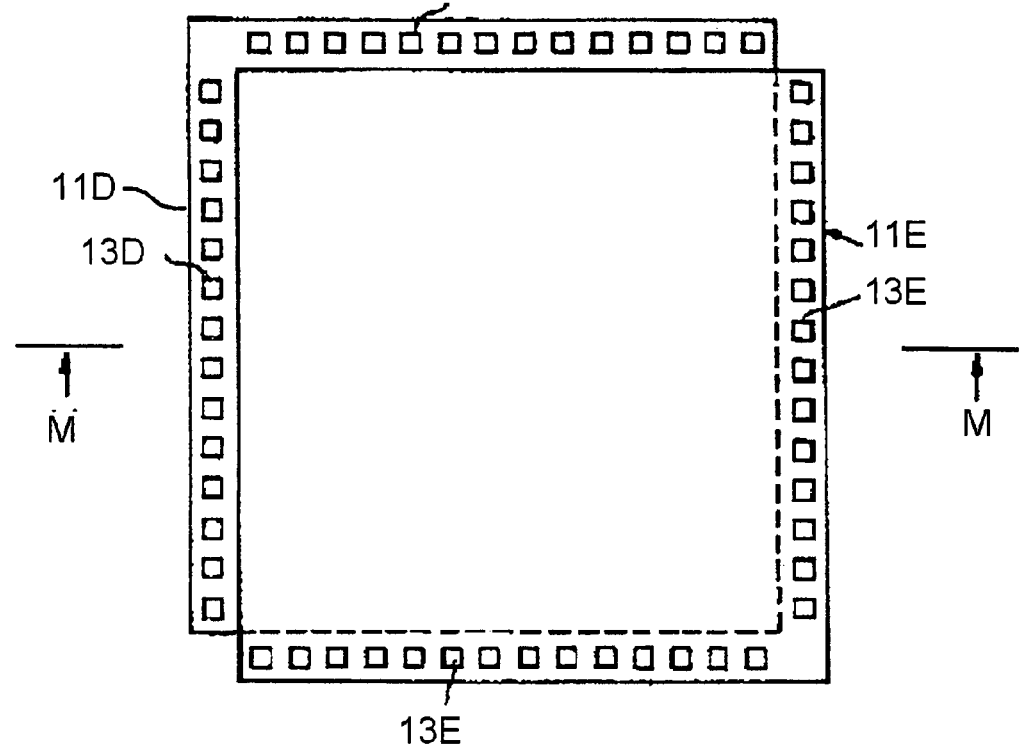
Figure 14:
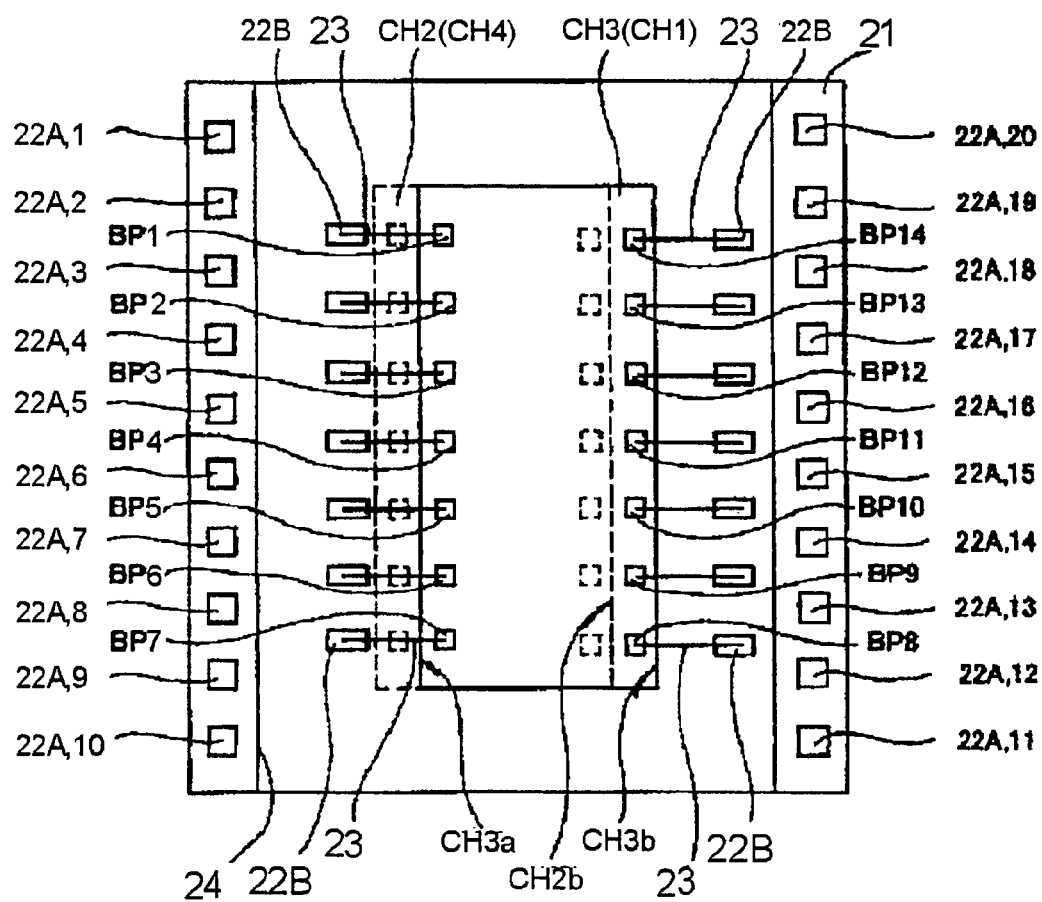
FIG. 14 is a plan view of a conventional semiconductor device.

FIG. 11 is a plan view of a semiconductor device 200 according to a second embodiment of the present invention. In the previous embodiment, the first semiconductor chip 110 and the second semiconductor chip 120 were arranged as being shifted in parallel from each other in the directions of the x-axis and y-axis, whereas in the second embodiment, the first semiconductor chip 110 and the second semiconductor chip 120 are arranged as being rotated from each other on the vertical axis, so as to shift the first bonding pads 112 and the second bonding pads 122 from each other. The fabrication processes therefor are same as those described in the previous embodiment, allowing omission of repetitive explanation.

Thus-fabricated semiconductor device 200 also makes it possible to exhibit effects similar to shown by the semiconductor device 100 of the previous embodiment.

Although the embodiments of the present invention have been described referring to the attached drawings, they are intended for showing only typical examples of the present invention, and allow adoption of any other configuration other than those described in the above.

It is apparent that the present invention is not limited to the above embodiments, that may be modified and changed without departing from the scope and spirit of the invention.

What is claimed is:

1. A semiconductor device comprising:
   a leadframe having an island portion, the island portion having first and second opposing surfaces;
   first and second semiconductor chips each having a top surface and a back surface, each said top surface having a plurality of bonding pads arranged on a peripheral area thereof, the back surfaces of the first and second semiconductor chips being mounted to the first and second surfaces of the island portion, respectively; and
   a mold resin covering the first and second semiconductor chips;
   wherein the first and second semiconductor chips are constructed so that in plan view, if the first and second semiconductor chips were arranged on respective said surfaces of the island portion with perimeters of the first and second semiconductor chips aligned, the bonding pads of the first semiconductor chip would overlap the bonding pads of the second semiconductor chip;
   wherein the first and second semiconductor chips are arranged respectively on the first and second surfaces of the island portion so that, in plan view, none of the bonding pads of the first semiconductor chip overlaps any of the bonding pads of the second semiconductor chip.

2. The semiconductor device according to Claim 1, wherein said leadframe has a plurality of leads which are wire-bonded by a plurality of wires to said plurality of bonding pads of said first and second semiconductor chips respectively at planar sites different from each other.

3. The semiconductor device according to Claim 2, wherein the first and second semiconductor chips, the leadframe, and the wires, when considered in a plan view of said semiconductor device, are arranged so that the plurality of wires that connect the leads of the leadframe to the bonding pads of the first semiconductor chip never overlap with the wires that connect the leads of the leadframe to the bonding pads of the second semiconductor chip.

4. A method of fabricating a semiconductor device comprising:
   providing first and second semiconductor chips each having a top surface and a back surface, each said top surface having a plurality of bonding pads arranged on a peripheral area thereof, the first and second semiconductor chips being constructed so that in plan view, if the first and second semiconductor chips were arranged back-to-back with perimeters of the first and second semiconductor chips aligned, the bonding pads of the first semiconductor chip would overlap the bonding pads of the second semiconductor chip;
   placing the back surface of the first semiconductor chip on one surface of an island portion of a leadframe;
   placing the back surface of the second semiconductor chip on the other surface of said island portion of said leadframe; and
   molding said first semiconductor chip and said second semiconductor chip with a mold resin;
   wherein the placing steps are performed so that the first and second semiconductor chips are arranged on the island portion so that, in plan view, the bonding pads of the first semiconductor chip do not overlap the bonding pads of the second semiconductor chip.

5. The method of fabricating the semiconductor device according to Claim 4, further comprising wire-bonding said plurality of first bonding pads and said plurality of second bonding pads by a plurality of wires to a plurality of leads of said leadframe, at planar sites different from each other.

6. The method of fabricating the semiconductor device according to Claim 5, wherein the placing and wirebonding steps are performed so that, when considered in plan view, the plurality of wires that connect the leads of the leadframe to the bonding pads of the first semiconductor chip never overlap with the wires that connect the leads of the leadframe to the bonding pads of the second semiconductor chip.

* * * * *